US005972233A

United States Patent [19]

Becker et al.

[11] Patent Number: 5,972,233

[45] Date of Patent: Oct. 26, 1999

[54] METHOD OF MANUFACTURING A DECORATIVE ARTICLE

[75] Inventors: Richard C. Becker, Ipswich; John R. Goodfellow, Essex, both of Mass.

[73] Assignee: Refractal Design, Inc., Danvers, Mass.

[21] Appl. No.: 08/594,587

[22] Filed: Jan. 31, 1996

[51] Int. Cl.[6] .................................. B44C 1/00; G03F 7/00

[52] U.S. Cl. .................................. 216/28; 216/54; 430/13

[58] Field of Search ............................ 216/54, 28; 430/13

[56] References Cited

U.S. PATENT DOCUMENTS 5,284,536 2/1994 Gruber ...................................... 156/58

*Primary Examiner*—R. Bruce Breneman

*Assistant Examiner*—Michael E. Adjodha

*Attorney, Agent, or Firm*—Iandiorio & Teska

[57] ABSTRACT

A method of manufacturing a decorative article, the method including: choosing a non-silicon substrate material which will form the substrate for the decorative article; coating the substrate with a photoresist material; forming a decorative graphic art image pattern in the photoresist coating; transferring the decorative graphic art image pattern in the photoresist coating to the substrate; and removing the photoresist coating.

8 Claims, 3 Drawing Sheets

METHOD OF MANUFACTURING A DECORATIVE ARTICLE

FIELD OF INVENTION

This invention relates to a method of manufacturing decorative articles such as jewelry, watch and clock faces, and similarly decorated articles.

BACKGROUND OF INVENTION

Decorated articles, e.g. jewelry including necklaces, pendants and rings, watch and clock faces, cuff links and the like are typically manufactured to include decorative designs by the following processes: painting, glazing, enameling, firing, inlaying, cloisonne, screening, engine turning, and engraving.

In these processes however, it is very difficult to form complex and intricate graphic art image designs on the substrate, which, for jewelry, for example, could be a piece of sapphire. Since an individual artist must typically transfer a particular graphic art image to the substrate, it is also very difficult in these processes to attain uniform and repeatable products of high quality. Painting, glazing, enameling, firing, inlay, and cloisonne methods depend on human dexterity and therefore are limited in the degree of detailing and complexity that may be accomplished in a particular decorative article. As explained above, repeatability and uniformity is also a concern: therefore, production quantities and product uniformity control are severely limited. Traditional screening overcomes some of these obstacles to a degree, but it has the physical limitation of individual geometry features having a minimum size of about 0.005–0.010 inch. Screening is also severely limited in the kinds of materials that may be used. Engine turning and engraving which add/or remove the material of the substrate in certain areas are also limited to the types of materials that may be used. Expensive tooling is required in these processes, and they are physically limited in feature size and materials. Moreover, all of these methodologies require significant expenditures of man hours thus raising the price of decorative articles containing intricately detailed and complex graphic art images.

SUMMARY OF INVENTION I

It is therefore an object of this invention to provide a method of manufacturing a decorative article.

It is a further object of this invention to provide a method of manufacturing a decorative article which allows the formation of very complex and intricately designed graphic art images on the substrate of the decorative article.

It is a further object of this invention to provide such a method of manufacturing a decorative article which facilitates the mass production of uniform and repeatable intricately designed decorative articles.

It is a further object of this invention to provide such a method of manufacturing a decorative article which facilitates the creation of graphic art images of very fine geometries, even less than one (1) micron.

It is a further object of this invention to provide such a method of manufacturing a decorative article which allows the utilization of a variety of materials.

It is a further object of this invention to provide such a method of manufacturing a decorative article which facilitates the ability to create fractal type patterns on pieces of jewelry.

It is a further object of this invention to provide such a method of manufacturing a decorative article which facilitates the design of multi-colored images on a substrate.

It is a further object of this invention to provide decorative articles such as jewelry items, watch or clock faces, and the like having complex and intricate graphic art images manufactured by the novel method of this invention.

This invention results from the realization that a wide variety of decorative articles can be efficiently mass produced to include very intricate and complex but also uniform and repeatable graphic art images, not by traditional techniques which require excellent human dexterity and/or delicate and expensive tooling and the expenditure of considerable time, but instead by utilizing modified photolithographic techniques known in the semi-conductor industry normally used to form non-decorative electronic circuitry patterns on semi-conductor chips.

This invention differs from the electronic circuitry application in that the goal is not to manipulate electrons but the reflection, transmission, and/or refraction of optical photons in order to provide a pleasing image to the viewer.

This invention features a method of manufacturing a decorative article. The method includes choosing a non-silicon substrate material which will form the substrate for the decorative article; coating the substrate with a photosensitive material; forming a decorative graphic art image pattern in the photosensitive coating; transferring the decorative graphic art image pattern in the photosensitive coating to the substrate; and then removing the photosensitive coating. The substrate material chosen may be sapphire or a number of other materials. The step of creating the decorative graphic art image pattern in the photosensitive material may include designing a graphic art image; creating a digitized representation of the image; and using the digitized representation of the image to expose the photosensitive coating in areas corresponding to the digitized representation of the image. Transferring the decorative graphic art image pattern to the substrate may include depositing an imaging material such as gold within the image pattern formed in the photosensitive coating. Alternatively, transferring the decorative graphic art image pattern to the substrate may include etching the substrate in the areas of the image pattern formed in the photosensitive coating; or first etching the substrate in areas of the image pattern formed in the photosensitive coating and then depositing an imaging material within the etched areas of the substrate.

A layer of protective transparent material may be added over the graphic art image pattern on the substrate to protect the image pattern from wear. Alternatively, the coating of photosensitive material may be applied to the bottom of the substrate to form the decorative graphic art image patten on the bottom of the substrate material and the substrate itself then protects the graphic art image pattern. The image is thus seen through the substrate. Many other variations are possible. The decorative graphic art image pattern may be a fractal design pattern formed from a series of discrete unconnected dots.

This invention also features a method of manufacturing a decorative article including: choosing a substrate material which will form the substrate of the decorative article; applying a first coating of a photosensitive material to the substrate; forming a first decorative graphic art image pattern in the first photosensitive coating; transferring the first decorative graphic art image pattern to the substrate; removing the first coating of photosensitive material; applying a second coating of photosensitive materials to the substrate; forming a second decorative graphic art image pattern in the second photosensitive coating; transferring the second decorative graphic art image to the substrate; and removing the second coating of photosensitive material.

This methodology is particularly useful for depositing an imaging material of a first color within the image pattern formed in the first coating of photosensitive material and then depositing an imaging material of a second color within the image pattern formed in the second coating of photosensitive material to form multi-colored graphic art images.

In another embodiment, the method includes choosing a non-silicon substrate material which will form the substrate for the decorative article; coating a first surface of the substrate with a photosensitive material; forming a decorative graphic art image pattern in the photosensitive coating; transferring the decorative graphic art image pattern to the substrate; removing the photosensitive coating; placing a reflective film on the first surface of the substrate; and mounting the assembly, reflective film side down, within a jewelry housing.

The invention also features various products formed by the methodologies disclosed and claimed.

DISCLOSURE OF PREFERRED EMBODIMENT

Other objects, features and advantages will occur to those skilled in the art from the following description of a preferred embodiment and the accompanying drawings, in which.

Figure 1:
FIG. 1 is a schematic view of one embodiment of a decorative article manufactured in accordance with the methodology of this invention.

Decorative article 10, FIG. 1, according to this invention includes a substrate body 12 such as a round flat piece of sapphire mounted in housing 14 of article 10 which in this case is a necklace. Substrate body 12 could be clear or colored glass, ceramic, various crystalline and poly-crystal materials both natural and laboratory created but generally not silicon. Synthetic sapphire, ruby, onyx, silicon oxides, diamond, gold, platinum, quartz, and garnet are the preferred materials for substrate body 12 which could form at watch or clock face, or be a part of a pendant, brooch, pin, bracelet, ring, cufflinks, tie clasp, button, buckle, or similar items.

In accordance with this invention, intricate and complex graphic art image 16 is formed from a series of dots that could be less than one (1) micron in diameter etched into or deposited (e.g. in gold) on the surface of substrate 12. Such an intricate and detailed graphic art image cannot be formed by painting, glazing, engraving, or even screening methodologies.

Figure 2A:
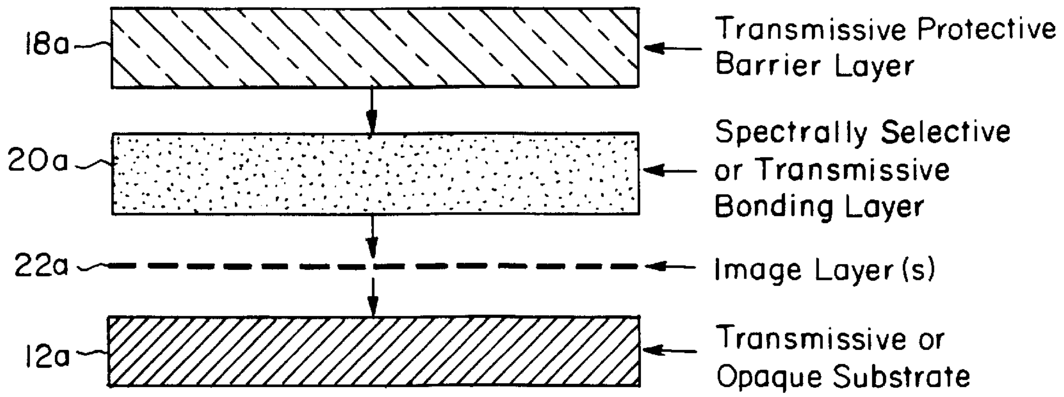
FIGS. 2A and 2B are side views of two embodiments of decorative article manufactured in accordance with the methodology of this invention.

The individual layers which make up article 10 are shown in FIG. 2A. As seen from the top, the first layer is a transmissive protective barrier layer 18*a*, typically sapphire, a clear epoxy, silicon-oxide, or glass. The next layer is spectrally selective or transmissive bonding layer 20*a*, typically a clear or colored but transmissive epoxy which bonds layer 18*a* to the imaging layer or layers 22*a* on transmissive on opaque substrate 12*a*.

Figure 2B:
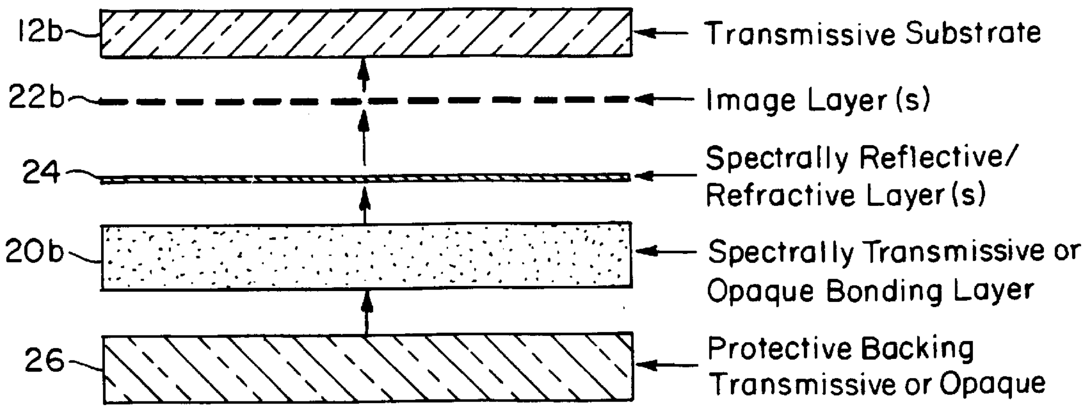

In another embodiment, the transmissive substrate 12*b*, FIG. 2B, has the imaging layer(s) 22*b* residing on the bottom of the substrate and also included is a spectrally reflective or refractive layer or layers 24 thereon. Layer 24 may be a dielectric coating of cobalt, for example. A spectrally transmissive or opaque bonding layer 20*b* bonds all the layers to protective backing 26 (e.g. glass, metal) which is transmissive or opaque.

Figure 3:
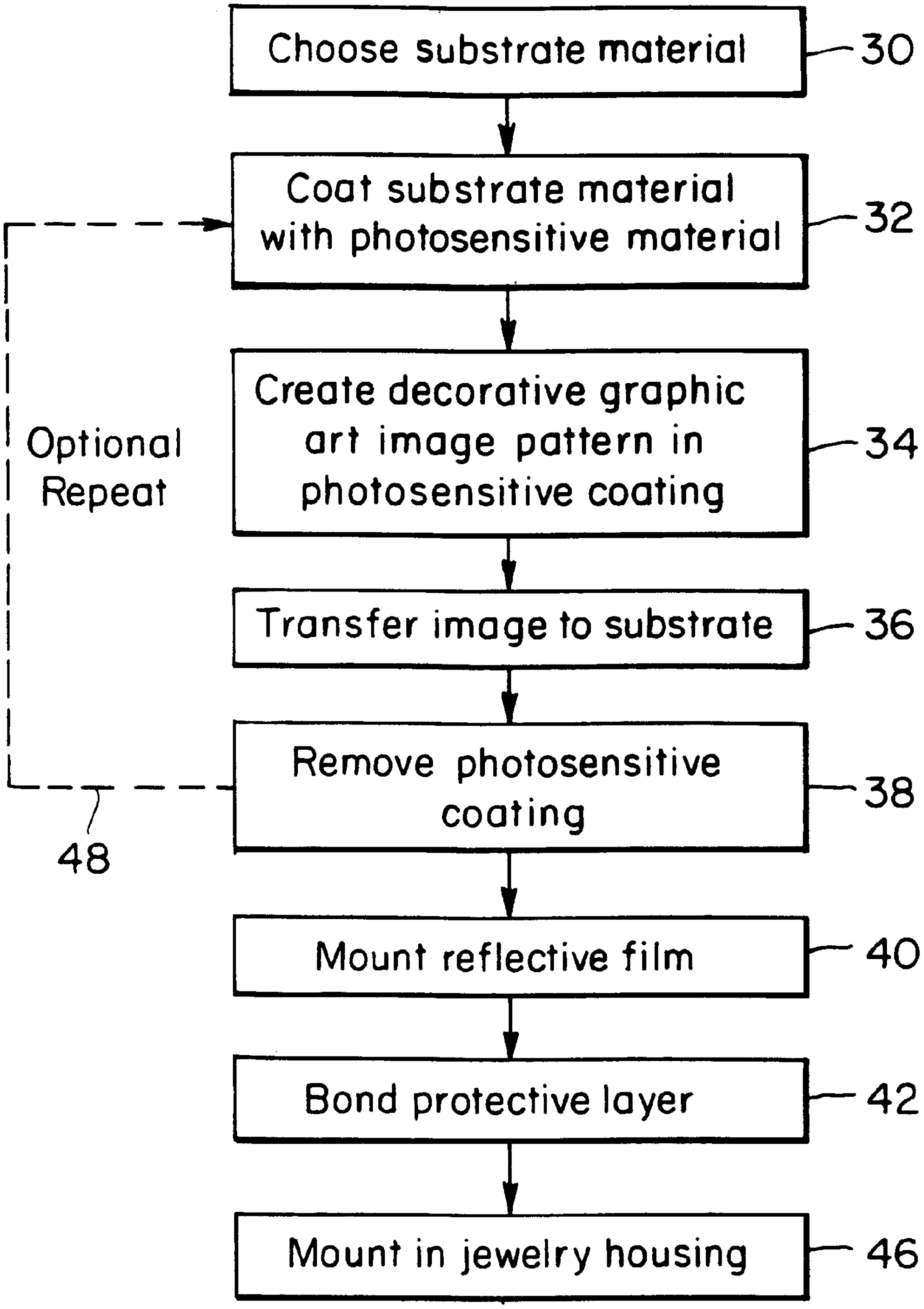
FIG. 3 is a block diagram depicting the method of manufacturing a decorative article in accordance with this invention.

Decorative graphic art image 16, FIG. 1, is formed on substrate 12 in accordance with the methodology depicted in the flow chart shown in FIG. 3. In step 30, a suitable substrate material is chosen such as sapphire, ruby or onyx depending on the decorative article to be manufactured. It is preferred that the substrate is a material which is non-semiconducting at room temperature. Next, the substrate is coated with a photosensitive material such as photoresist material, step 32. Suitable photoresist materials used in the art of photolithography are listed in the book *Integrated Circuit Fabrication Technology*, By David J. Elliot, 1982. Next, the decorative graphic art image created, step 34, and rendered in the photoresist material and exposed by various known methodologies to yield either a positive or negative mask of the desired graphic art image pattern, step 34.

The image is then transferred to the substrate by vacuum physical vapor deposition (evaporation, sputtering, arc discharge, or laser ablation). Simultaneous ion beam bombardment may also be employed (ion beam assisted deposition). The deposition is subsequently modified using some combination of 1) step 38 liftoff, 2) heat treatment (annealing), and/or 3) etching (wet chemical, plasma, or ion beam). The reflective layer 24, FIG. 2B, is then deposited, step 40, FIG. 3 and the backing material is mounted using an epoxy, step 42, before and it is mounted in a jewelry housing, step 46.

In a preferred embodiment, FIG. 2A, the intricate graphic art image is formed on the bottom of the substrate since then the substrate will act to protect and prevent wear of the image. If, however, the graphic art image is formed on the top of the substrate, it is recommended that additional protective coatings, 12*b*, FIG. 2B, such as a hard oxide or a diamond-like material be applied to the top of the substrate to protect the image. The imaging deposition material may be alloys of gold, platinum, silver, chromium, aluminum, titanium, zirconium, boron, silicon, chromium, cobalt, other metals, oxides, nitrides, sulfides, fluorides, chlorides, other ceramics, or a diamond-like material.

In an optional manufacturing step, as shown by dotted line 48, the photolithographic processes may be reiterated by suitable means and registration and successive layers in certain areas may be modified to build different kinds of images. For example, various color schemes in a particular image may be created by first depositing a material of one color (e.g. gold) in the photoresist coating pattern, removing that photoresist layer, adding another photoresist coating, etching it away in certain areas, and then depositing a different color material (e.g. platinum).

The graphic art image pattern may be a mathematically generated fractal design stored in digital form in a computer memory in a bit map format and that digital data may then be used to imprint a highly detailed dot matrix design onto a photoresist coated substrate disc of a synthetic substrate to be typically deposited in gold, platinum, silver, chromium, aluminum, titanium, zirconia, boron, silicon, chromium, or cobalt using photo-lithographic equipment which is normally used to create patterns of electronic circuitry. Unlike electric circuitry patterns, decorative graphic art image 16, FIG. 1, can be made multi-colored, and usually the individual discrete gold dots of material are not in contact with each other. Moreover, unlike electronic circuitry, various reflective films may be placed over the substrate to provide a visually pleasing effect. Instead of manipulating the flow of electrons, the subject invention manipulates the controlled transmission, reflection or refraction or refraction of photons yielding a visually pleasing intricately designed decorative article without the need for engraving or painting techniques. This novel manufacturing process assures a high rate of production yielding uniform products of a high quality. As seen by the eye, the image may appear on the top of the substrate or the bottom of the substrate and the substrate may be mounted in the jewelry housing either way. Protective layers, reflective layers, refractive layers, and other layers may be added to create a unique image and a unique decorative article.

Although specific features of the invention are shown in some drawings and not others, this is for convenience only as some feature may be combined with any or all of the other features in accordance with the invention.

Other embodiments will occur to those skilled in the art and are within the following claims:

What is claimed is:

1. A method of manufacturing a decorative article, the method comprising:

choosing a non-silicon substrate material which will form the substrate for the decorative article;

coating a first surface of the substrate with a photosensitive material;

forming a decorative graphic art image pattern in the photosensitive coating;

transferring the decorative graphic art image pattern to the substrate;

removing the photosensitive coating;

placing a reflective film on the first surface of the substrate; and mounting the assembly, reflective film side down, within a jewelry housing.

2. The product formed by the process of claim 1.

3. A method of manufacturing a decorative article, the method comprising:

choosing a non-semiconductor substrate material which will form the substrate for the decorative article;

coating the first surface of the substrate with a photosensitive material;

forming a decorative graphic art image pattern in the photosensitive coating;

transferring the decorative graphic art image pattern to the substrate;

removing the photosensitive coating; and mounting the assembly, first surface side down, within a jewelry housing.

4. The product formed by the process of claim 3.

5. A method of manufacturing a decorative article, the method comprising:

choosing a non-semiconducting substrate from the class of materials commonly employed in jewelry and the decorative arts;

coating the substrate with a photosensitive material;

forming a decorative graphic art image in the photosensitive coating by optical exposure, followed by selective removal of the exposed coating;

preparing the substrate by ion bombardment in order to erode and randomly texturize the area of the decorative graphic image, providing a protective depression, enhancing non-specular optical reflection, and improving adhesion of the subsequent coating;

depositing a decorative graphic image in the prepared area, in which the perceived color solely results from the selective electro-magnetic absorption and reflection of light within the bulk deposited material, providing a constant color independent of light source and viewing angle relationships, and not by optical interference or diffraction phenomena which result from the geometric pattern of the graphic image and whose colors change with varying light source and viewing angle relationships;

removing the photosensitive material and excess coating which are not contained within the decorative graphic image; and performing the process of depositing a decorative graphic image in one or more iterations on a single substrate, each iteration employing a different decorative graphic image precisely registered spatially to the first, and each employing a different coating material in order to produce a plurality of perceived colors, resulting in a composite image.

6. The method of claim 5 in which the step of forming the decorative graphic art image in the photosensitive material comprises:

designing a graphic art image which may be comprised of a pattern of unconnected dots, curvilinear lines, or filled polygonal regions, none of which are designed to produce optical interference or diffraction phenomena;

creating a representation of the image; and using the representation of the image to expose the photosensitive coating in areas corresponding to the representation of the image.

7. The method of claim 5 in which step of preparing the surface of the substrate, the ion bombardment comprises:

creating a separate source of accelerated ions;

directing the ions at the substrate; and eroding the substrate in the graphic art image by sputtering.

8. The method of claim 5 in which the step of coating comprises:

depositing by physical vapor deposition (evaporation or sputtering); or depositing by physical vapor deposition with any additional combination of simultaneous ion bombardment or a chemically reactive background species.

* * * * *